US008557341B2

(12) United States Patent
Yang et al.

(10) Patent No.: US 8,557,341 B2
(45) Date of Patent: Oct. 15, 2013

(54) PATTERNING STRUCTURES USING DEFORMABLE SUBSTRATES

(75) Inventors: Shu Yang, Blue Bell, PA (US); Ying Zhang, Corning, NY (US); Randall Kamien, Philadelphia, PA (US); James Makoto Kikkawa, Swarthmore, PA (US); Elisabetta Matsumoto, Kensington, CA (US); Dinesh Chandra, Amherst, MA (US)

(73) Assignee: The Trustees Of The University Of Pennsylvania, Philadelphia, PA (US)

( * ) Notice: Subject to any disclaimer, the term of this patent is extended or adjusted under 35 U.S.C. 154(b) by 720 days.

(21) Appl. No.: 12/596,777

(22) PCT Filed: Apr. 23, 2008

(86) PCT No.: PCT/US2008/061293
§ 371 (c)(1),
(2), (4) Date: Aug. 26, 2010

(87) PCT Pub. No.: WO2009/009208
PCT Pub. Date: Jan. 15, 2009

(65) Prior Publication Data
US 2011/0033672 A1    Feb. 10, 2011

Related U.S. Application Data

(60) Provisional application No. 60/913,417, filed on Apr. 23, 2007.

(51) Int. Cl.
*B05D 3/00*    (2006.01)

(52) U.S. Cl.
USPC ........... 427/271; 427/256; 427/261; 427/264; 427/275

(58) Field of Classification Search
USPC .......................... 427/256, 261, 264, 271, 275
See application file for complete search history.

(56) References Cited

U.S. PATENT DOCUMENTS

| 2002/0050220 A1* | 5/2002 | Schueller et al. ............. 101/486 |
| 2005/0016851 A1 | 1/2005 | Jensen et al. |
| 2005/0191419 A1 | 9/2005 | Helt |
| 2007/0042174 A1 | 2/2007 | Rao et al. |

FOREIGN PATENT DOCUMENTS

WO   WO 2009/009208    1/2009

OTHER PUBLICATIONS

Bertoldi et al., "Mechanically triggered transformations of phononic band gaps in periodic elastomeric structures", Physical Review B, Feb. 27, 2008, 77(5), 4 pp.
Bertoldi et al., "Mechanics of Deformation-Triggered Pattern Transformations and Superelastic Behavior in Periodic Elastomeric Structures", Journal of Mechanics and Physics of Solids, Mar. 7, 2008, 1-27.

(Continued)

*Primary Examiner* — Michael Cleveland
*Assistant Examiner* — Xiao Zhao
(74) *Attorney, Agent, or Firm* — Woodcock Washburn, LLP

(57) ABSTRACT

Aspects of the present invention describe soft imprint lithography methods capable of preparing structural features on surfaces. Disclosed methods include surmounting a deformable substrate, having an original form, with a composition, wherein the deformable substrate is capable of achieving at least one predetermined deformed state; predictably deforming said deformable substrate from its original form to the at least one predetermined deformed state; and transferring at least a portion of the composition surmounting the deformed substrate to a receiving substrate.

56 Claims, 22 Drawing Sheets

Interaction of Dislocation Dipoles

Burgers' vector b    dipole vector d $$E = \frac{1}{2} \int d^2x \left[ \underbrace{\lambda (u_{ii})^2 + 2\mu u_{ij}^2}_{\text{Lamé Constants}} \right]$$

$$E \propto -\frac{Y_2 b^2 d^2}{R^2} \cos(\theta_1 + \theta_2) \sin\theta_1 \sin\theta_2$$

(56) References Cited

OTHER PUBLICATIONS

Bertoldi et al., "Negative Poisson's Ratio Behavior Induced by an Elastic Instability", Advanced Materials, Jan. 19, 2010, 22(3), 361-366.
Deschanel et al., "Pattern Transformation Triggered by Deformation", Physical Review Letters, Aug. 24, 2007, 084301-1-084301-4.
Heckenberg et al., "Generation of optical phase singularities by computer-generated holograms", Optics Letters, Feb. 1, 1992, 17(3), 221-223.
Jang et al., "Combining Pattern Instability and Shape-Memory Hysteresis for Phononic Switching", Nano Ltters, Feb. 25, 2009, 9(5), 2113-2119.
Krishnan et al., "Optical Properties of Two-Dimensional Polymer Photonic Crystals After Deformation-Induced Pattern Transformations", Journal of the Mechanics and Physics of Solids 57, May 21, 2009, 1500-1513.
Lee et al., "Solvent compatibility of poly(dimethylsiloxane)-based microfluidic devices", Anal. Chem., Dec. 1, 2003, 75(23), 6544-6554.
Lin et al., "Spontaneous formation of one-dimensional ripples in transit to highly ordered two-dimensional herringbone structures through sequential and unequal biaxial mechanical stretching", S. Appl. Phys. Lett., Jun. 12, 2007, 90(24), 241903-1-241903-3.
Lu et al, "High-Density Silver Nanoparticle Film with Temperature-Controllable Interparticle Spacing for a Tunable Surface Enhanced Raman Scattering Substrate" Nano letters, Jan. 2005, 5(1), 5-9.
Matsumoto et al., "Elastic-Instability Triggered Pattern Formation", Physical Review E, 80, Aug. 12, 2009, 80, 021604-1-021604-15.
Michel et al., "Microscopic and Macroscoic Instabilities in Finitely Strained Porous Elastomers", Journal of the Mechanics and Physics of Solids, May 2007, 55(5), 900-938.
Park et al, "Superlattice and Magnetism Directed by the Size ana Shape of Nanocrystals" Chemphyschem, Jun. 17, 2002, 3(6), 543-547.
Singamaneni et al., "Instabilities and Pattern Transformation in Periodic, Porous Elastoplastic Solid Coatings", ACS Applied Materials and Interfaces, Feb. 7, 2009, 1(1), 42-47.
Singamaneni et al., "Bifurcated Mechanical Behavior of Deformed Periodic Porous Solids", Advanced Functional Materials, May 8, 2009, 19(9), 1426-1436.
Whitesides et al., "Overpressure Contact Printing and Its Applications in the Fabrication of Arrays of Magnetic Rings" LLE Review, Annual Report, Oct. 2003-Sep. 2004, vol. 99, 218-225.
Zhang et al., "Replica Molding of High-Aspect-Ratio Polymeric Nanopillar Arrays with High Fidelity", Langmuir, Sep. 26, 2006, 22(20), 8595-8601.
Zhang et al., "Creating a Library of Complex Metallic Nanostructures via Harnessing Pattern Transformation of a Single PDMS Membrane", ACSNano, Jul. 23, 2009, 3(8), 2412-2418.
Zhu et al., "Two-Dimensional Photonic Crystals with Anisotropic Unit Cells Imprinted From Poly (dimethylsiloxane) Membanes Under Elastic Deformation", Applied Physics Letters, Oct. 24, 2008, 93, 161911-1-161911-3.

\* cited by examiner

Step A    Step B    Step C

Step A  Step B  Step C

PATTERNING STRUCTURES USING DEFORMABLE SUBSTRATES

CROSS-REFERENCE TO RELATED APPLICATIONS

This application is the National Stage of International Application No. PCT/US2008/061293, filed Apr. 23, 2008, which claims the benefit of U.S. Provisional Application No. 60/913,417, filed Apr. 23, 2007, the disclosures of which are incorporated herein by reference in their entirety.

STATEMENT OF GOVERNMENT RIGHTS

The invention was made with U.S. Government support. The Government may have certain rights in the invention under NSF Grant No. MRSEC DMR-05-20020.

TECHNOLOGY FIELD

The present invention is generally related to the field of nanotechnology. The present invention is also related to the field of soft lithography, and more particularly to the field of patterning nano- and microstructures on surfaces.

BACKGROUND

Fabrication of nanostructures has traditionally been performed using various photolithographic techniques. State-of-the-art photolithographic techniques are capable of mass-producing well-defined nanostructures (as small as 60 nm) in thin films of photoresists reproducibly over a large area. Other techniques such as soft X-ray lithography, e-beam lithography and scanning probe methods can also produce nanometer features in serial writing processes. Although these techniques offer precision and the ability to produce extremely small structures, they are expensive and are primarily applicable to the fabrication of semiconductors. Furthermore, these techniques are limited for use with photosensitive materials, and rigid/flat substrates.

An alternative to photolithography techniques is soft lithography. Soft lithography is a non-photolithographic, low-cost method that can pattern feature sizes ranging from 30 nm to 100 μm over a large area. It uses a patterned elastomer, often polydimethylsiloxane (PDMS), as the stamp, mold, or flexible mask to generate nano- and micropatterns. The benefits of this technique are that it is more cost-effective and it can be applied to a wide range of materials, including polymers, biomaterials, ceramics, metals, semiconductors, and hybrids with specific substrate chemistry. Furthermore, it is transferable to both flat and nonplanar substrates.

A down-side to soft lithography is that when the patterns become smaller (i.e., sub-100 nm), the low modulus of the elastomer mold or stamp tends to deform. This deformation leads to the pattern collapsing and corners rounding. These collapsed patterns and rounded corners in the mold result in nanostructures that are not uniform and that may not be useful for their intended purpose. Many approaches have been investigated to minimize this pattern deformation, such as using composite elastomers. The rigidity of the composite mold, however, also brings about undesirable features, such as less conformal contact on a nonplanar substrate, distortion caused by the thermal expansion coefficient mismatch between different components of the elastomer, and incompatibility with existing commercial printing systems due to rigid backing layers. Therefore, it is highly desirable to pattern sub-100 nm features by taking advantage of the conventional soft lithography process without compromising its wide applicability.

In "Overpressure Contact Printing and Its Applications in the Fabrication of Arrays of Magnetic Rings." *LLE Review*, Volume 99, pp. 218-225, Whitesides et al. explored the deformable nature of PDMS through the use of overpressure contact printing. This work, however, does not address structures smaller than 1 μm, and furthermore only employed the use of externally applied pressure to deform PDMS molds. Accordingly, further work is needed for applying such soft lithographic techniques for preparing nano- and microstructures smaller than about 1 μm.

SUMMARY

Certain aspects of the present invention describe methods for predictably patterning a structure comprising: surmounting a deformable substrate, having an original form, with a composition, wherein the deformable substrate is capable of achieving at least one predetermined deformed state; predictably deforming said deformable substrate from its original form to the at least one predetermined deformed state; and transferring at least a portion of the composition surmounting the deformed substrate to a receiving substrate.

The general description and the following detailed description are exemplary and explanatory only and are not restrictive of the invention, as defined in the appended claims. Other aspects of the present invention will be apparent to those skilled in the art in view of the detailed description of the invention as provided herein.

BRIEF DESCRIPTION OF THE DRAWINGS

The summary, as well as the following detailed description, is further understood when read in conjunction with the appended drawings. For the purpose of illustrating the invention, there are shown in the drawings exemplary embodiments of the invention; however, the invention is not limited to the specific methods, compositions, and devices disclosed. In addition, the drawings are not necessarily drawn to scale. In the drawings.

DETAILED DESCRIPTION OF ILLUSTRATIVE EMBODIMENTS

Figure 1A:
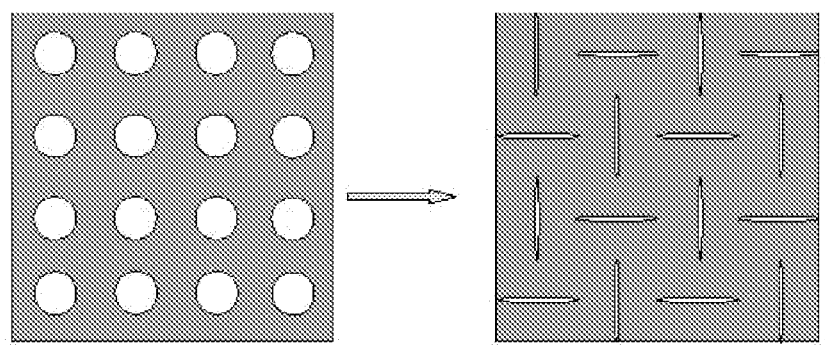
FIG. 1A shows an exemplary deformable substrate in its original form and after deformation.

The present invention may be understood more readily by reference to the following detailed description taken in connection with the accompanying figures and examples, which form a part of this disclosure. It is to be understood that this invention is not limited to the specific devices, methods, applications, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

It is to be appreciated that certain features of the invention which are, for clarity, described herein in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

As used herein, spatial or directional terms, such as "inner", "outer", "left", "right", "up", "down", "horizontal", "vertical", and the like, relate to the invention as it is shown in the drawing figures. However, it is to be understood, that the invention can assume various alternative orientations and, accordingly, such terms are not to be considered as limiting. Further, all numbers expressing dimensions, physical characteristics, and so forth, used in the specification and claims are to be understood as being modified in all instances by the term "about". Accordingly, unless indicated to the contrary, the numerical values set forth in the following specification and claims can vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques. Moreover, all ranges disclosed herein are to be understood to encompass any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1 to 6.7, or 3.2 to 8.1, or 5.5 to 10.

Aspects of the present invention disclose methods for predictably patterning a structure comprising: surmounting a deformable substrate, characterized as having an original form, with a composition, wherein the deformable substrate is capable of achieving at least one predetermined deformed state; predictably deforming said deformable substrate from its original form to the at least one predetermined deformed state; and transferring at least a portion of the composition surmounting the deformed substrate to a receiving substrate.

FIG. 1A shows an exemplary deformable substrate in its original form 100a and after deformation 100b. The deformable substrate in its original form may comprise a polymer material 110, at least one cavity 120, and at least one nano- or microstructure 125. Suitable deformable substrates include any polymer that is capable of being deformed under strain induced by solvent, heat, light, volume change, magnetic force, electrical field, pH, or any combination thereof. More particularly, in certain embodiments, the polymer utilized as the deformable substrate includes polydimethylsiloxane, a polydimethylsiloxane composite, poly(N-isopropyl acrylamide), poly(acrylic acid), poly(methacrylic acid), poly(2-hydroxyethylmethacrylate), polyurethane, poly(ethylene glycol), poly(ethylene terephthalate), poly(ethylene 1,4-napthanate), poly(ethylene 1,5-napthanate), poly(ethylene 2,6-napthanate), poly(ethylene 2,7-napthanate), or any copolymer thereof, or any composite thereof, or any combination thereof.

The cavities 120 may be of various shapes and sizes. In certain embodiments, the nano- or microstructures 125 may comprises pillars, cylinders, particles, rods, or any combination thereof. In further embodiments, these nano- or microstructures 125 have high aspect ratios. In certain embodiments, the aspect ratio is greater than about 2. In preferred embodiments, the aspect ratio is greater than about 9. In more preferred embodiments, the aspect ratio is greater than about 25. Following deformation, the cavities 180 may be deformed to a shape and/or size different that the original shape and/or size of the cavity.

Figure 1B:
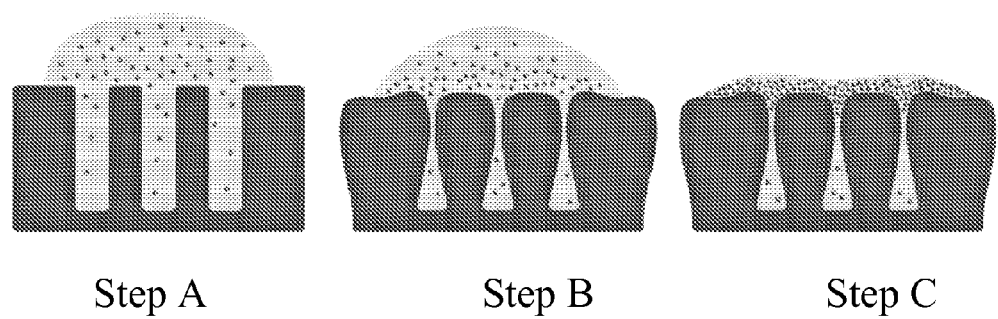
FIG. 1B shows an exemplary method for patterning structures using deformable substrates.
Figure 1C:
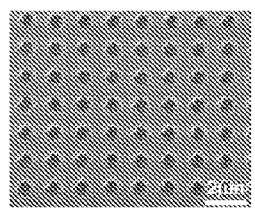
FIG. 1C shows SEM images of the original PDMS membrane with hole diameter of 1 μm, pitch of 2 μm and height of 9 μm, the deformed PDMS after removing the nanoparticles film, and an $Fe_3O_4$ assembly on a square array of PDMS membrane, resulting in herringbone structures.
Figure 1C:
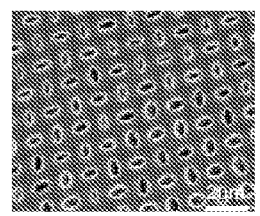
Figure 1C:
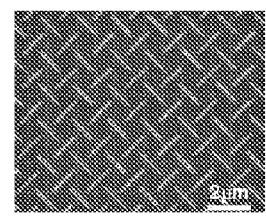
Figure 2:
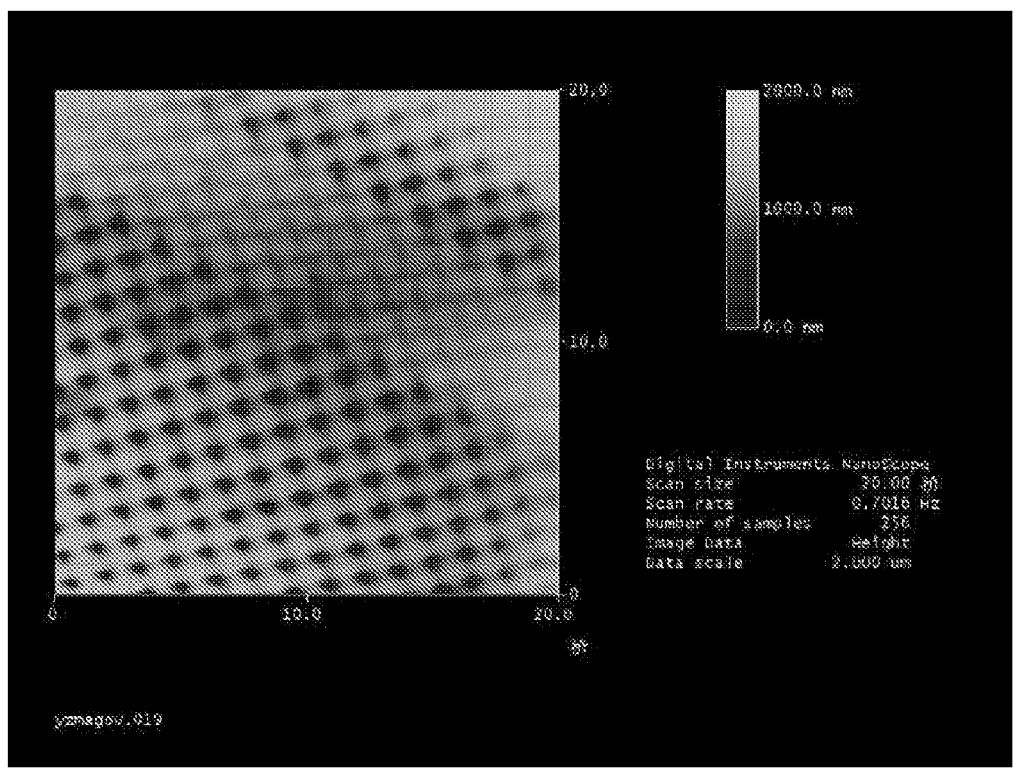
FIG. 2 is an AFM image of a PDMS membrane in toluene before complete drying. A herringbone pattern on top of the image can be clearly seen, which is due to the deformation of the PDMS that squeezes the pores.
Figure 3A:
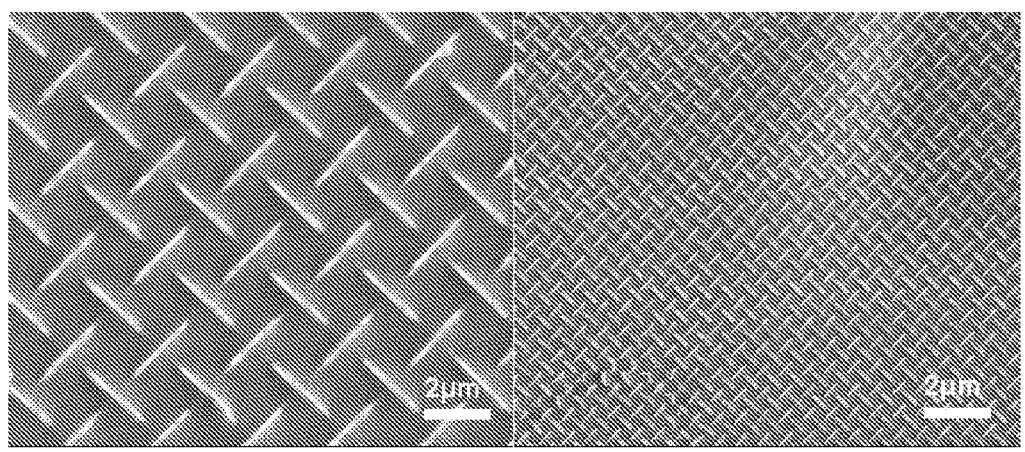
FIG. 3a is an SEM image of an $Fe_3O_4$ nanoparticle assembly from square patterned PDMS membranes with holes of diameter of 1 μm, pitch of 2 μm and height of 9 μm.
Figure 3B:
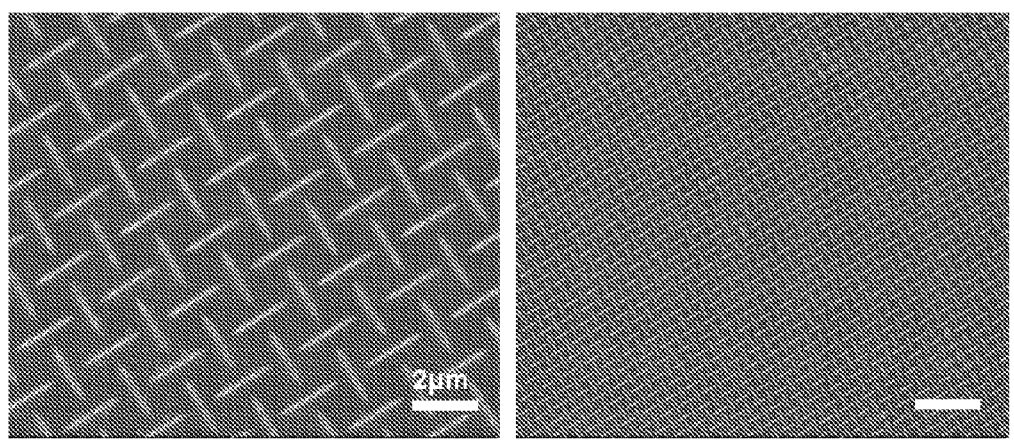
FIG. 3b is an SEM image of an $Fe_3O_4$ nanoparticle assembly from square patterned PDMS membranes with holes of diameter of 750 nm, pitch of 1.5 μm and height of 9 μm.
Figure 3C:
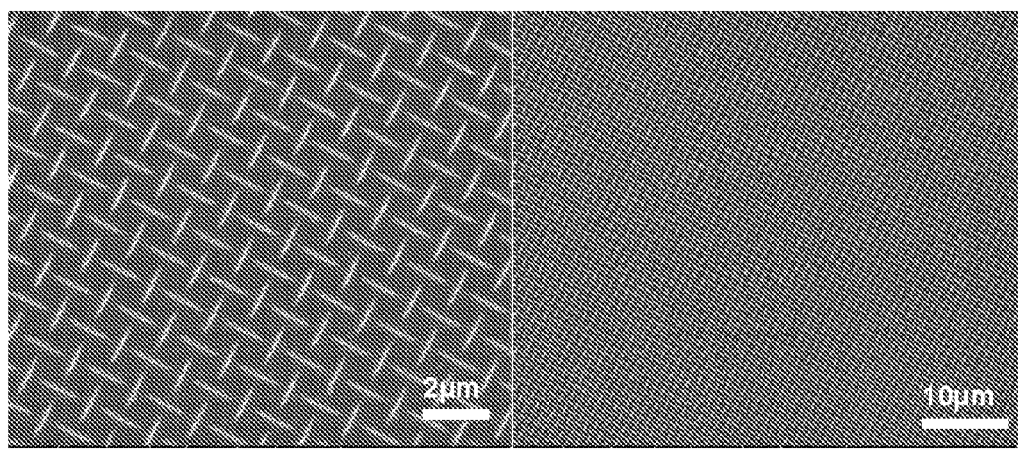
FIG. 3c is an SEM image of an $Fe_3O_4$ nanoparticle assembly from square patterned PDMS membranes with holes of diameter of 500 nm, pitch of 1.5 μm and height of 9 μm.
Figure 3D:
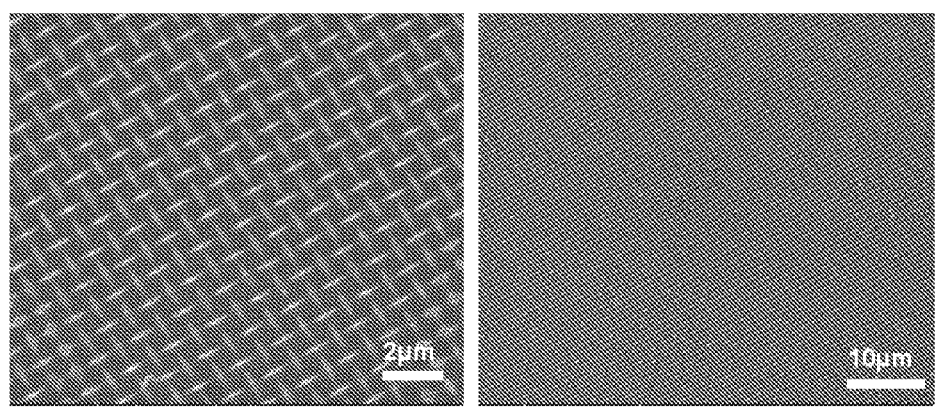
FIG. 3d is an SEM image of an $Fe_3O_4$ nanoparticle assembly from square patterned PDMS membranes with holes of diameter of 400 nm, pitch of 800 nm and height of 9 μm.
Figure 3E:
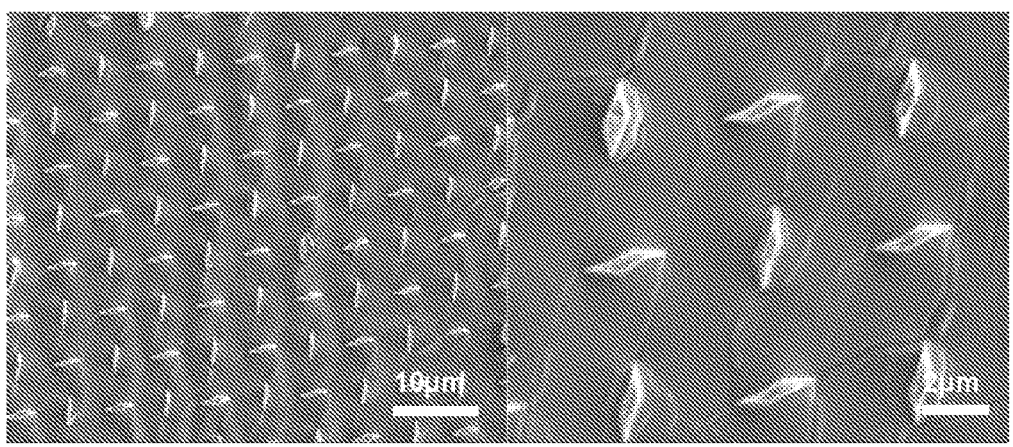
FIG. 3e is an SEM image of an Fe$_3$O$_4$ nanoparticle assembly from square patterned PDMS membranes with holes of diameter of 2 µm, pitch of 5 µm and height of 4 µm.
Figure 4:
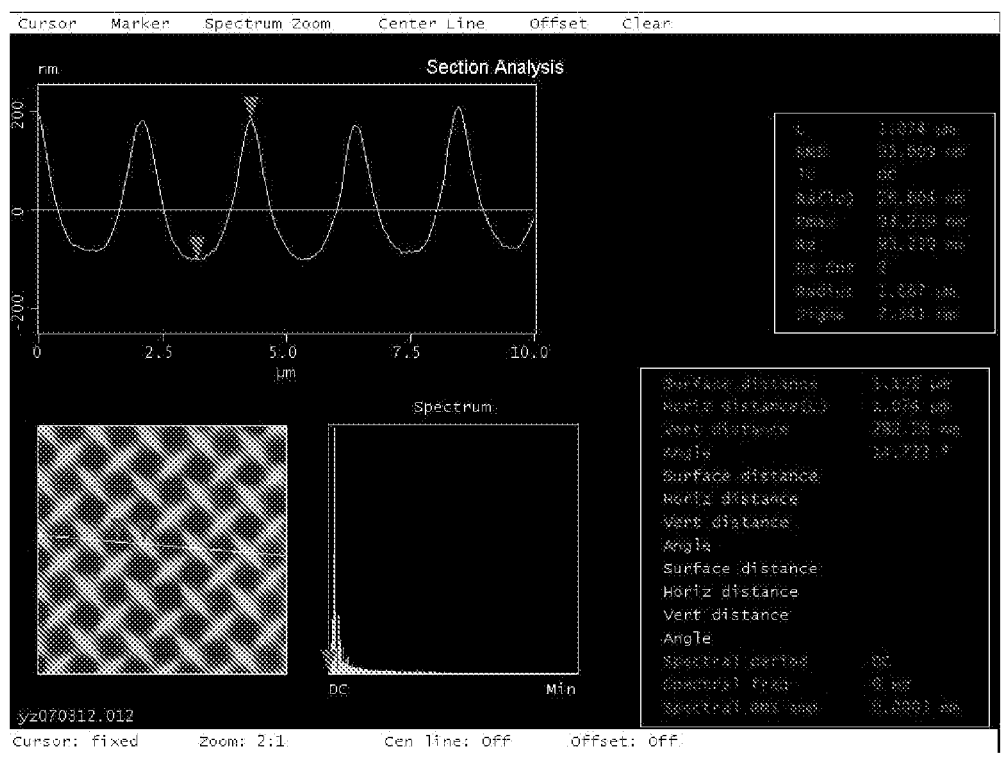
FIG. 4 is an image analysis cross-sectional AFM image of an Fe$_3$O$_4$ nanoparticle pattern from 750 nm holes as seen in FIG. 3b.
Figure 5:
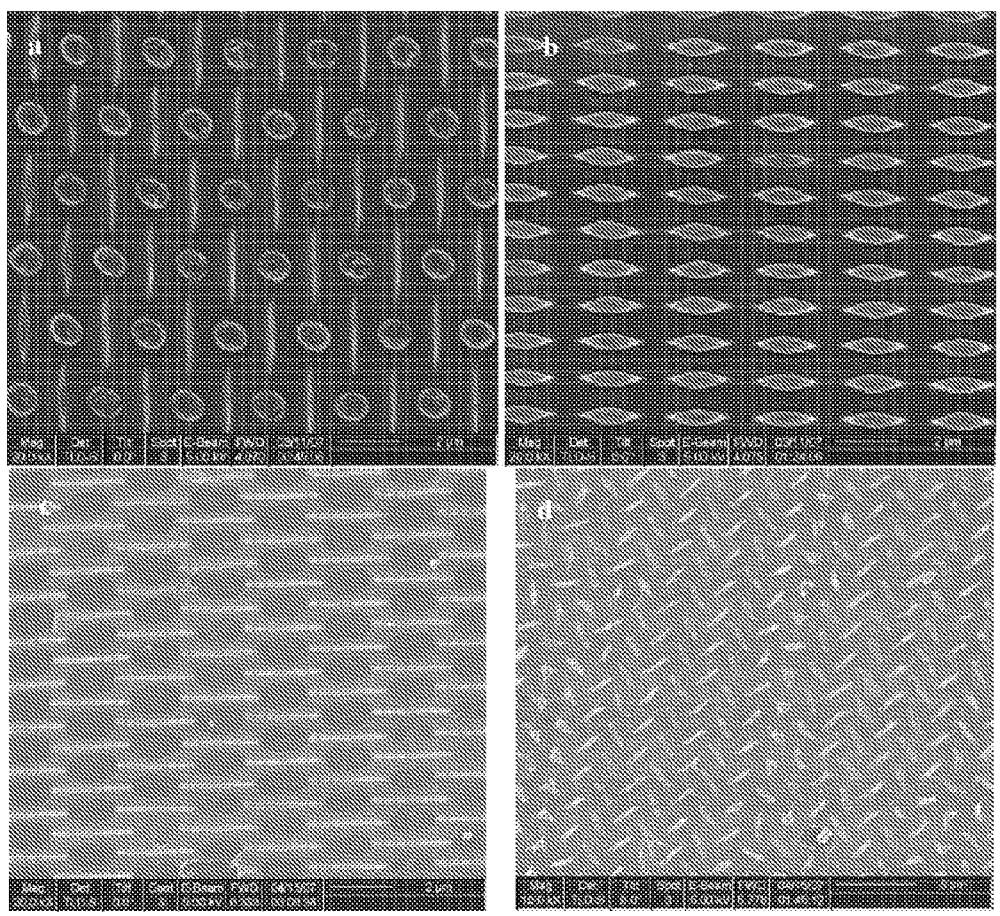
FIG. 5 is an SEM image of Fe$_3$O$_4$ nanoparticle patterns formed from different PDMS membranes. a-b) The PDMS membrane (see FIG. 10 was stretched in one planar direction with (a) 40% and (b) 60% strains, respectively. c) The PDMS membrane (see FIG. 10 was stretched in a 45 direction along y axis. d) From hexagonal patterned PDMS membrane.
Figure 6:
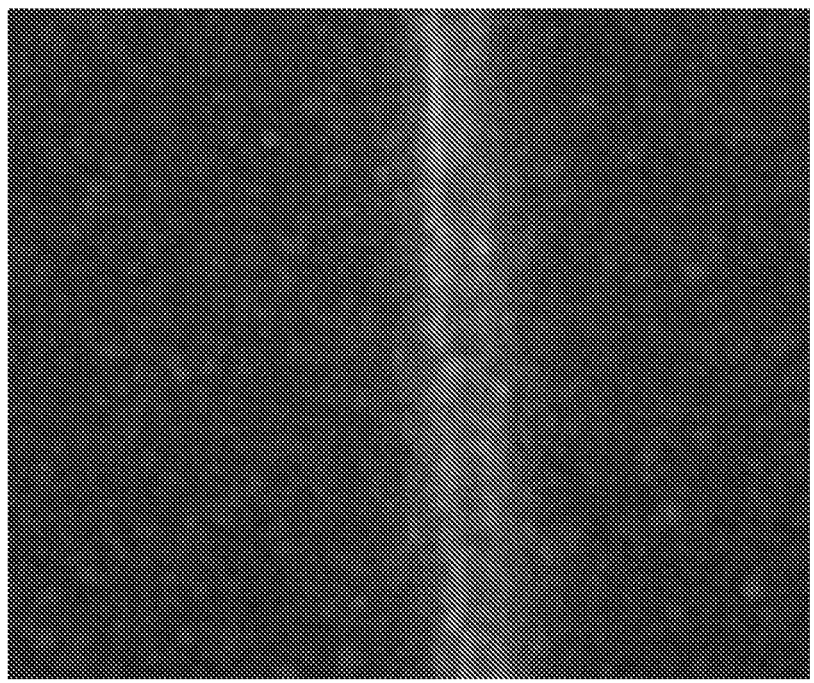
FIG. 6 is an SEM image of Fe$_3$O$_4$ nanoparticle film formed from PDMS membranes with holes of diameter of 1 µm, pitch of 2 µm and height of 9 µm, resulting in sub-100 nm patterns.

FIG. 1B shows an exemplary method for patterning structures using deformable substrates. Step A shows a deformable substrate in its original form 100a surmounted by a composition 140. Suitable techniques for surmounting the deformable substrate with a composition include drop-casting, dip-coating, spin-casting, cotton-swab wiping, microcontact printing, application by roller, or any combination thereof.

Suitable compositions 140 for the present invention may include nanoparticle dispersions, polymeric dispersions, polymer solutions, prepolymer precursors, sol-gel precursors, organic hybrid precursors, inorganic hybrid precursors, organic liquid dispersions, cell dispersions, protein dispersions, DNA dispersions, peptide dispersions, or any combination thereof. In certain embodiments, the nanoparticle dispersion includes at least one nanoparticle assembly, colloidal nanoparticle assembly, or any combination thereof. The nanoparticle dispersion may be monodisperse or polydisperse. The particles in the dispersion may have varied properties. In certain embodiments, the dispersion contains particles of different sizes. In certain embodiments, the dispersion may comprise particles of different shapes. In further embodiments the dispersion contains particles with different physical properties such as different refractive indices and/or transparencies at different wavelengths.

Suitable types of nanoparticles 160 include metal nanoparticles, semiconductor nanoparticles, polymer based nanoparticles, carbon based nanoparticles, or any combination thereof. Suitable metals for metal nanoparticles include noble metals, ferrous metals, non-ferrous metals, oxides of ferrous metals and non-ferrous metals, metal alloys, or any combination thereof. Suitable noble metals include gold, silver, platinum, or any combination thereof. Suitable non-ferrous metals include cobalt, nickel, aluminum, titanium, copper, zinc, copper, or any combination thereof. Suitable oxides of ferrous metals and non-ferrous metals include iron(2+) oxide, iron(3+) oxide, zirconium oxide, titanium oxide, tin oxide, aluminum(3+) oxide, aluminum(2+) oxide, or any combination thereof. In an exemplary embodiment, the oxide may be iron(3+) oxide. Suitable metal alloys include FePt. Suitable semiconductor nanoparticles include CdSe, CdS, CdTe, ZnS, SiO2, Si, PbSe, SiGe, Ge, ZnSe, ZnO, GaAs, GaAlAs, GaN, GaAlN, GeTe, (Ga,Mn)As, (Zn,Mn)As, (Zn,Mn)S, (Cd,Mn)S, (Cd,Mn)Se, (Zn,Mn)O, (Ga,Mn)N, or any combination thereof including core-shell geometries, ordered alloys, random alloys, solid solutions, or random or ordered phase separated mixtures. Suitable polymer-based nanoparticles include polystyrene, poly(methyl methacrylate), poly(N-isopropylacrylamide), poly(lactic acid-co-glycolic acid), block copolymers, such as poly(styrene-b-methacrylate), poly(ethylene oxide-b-styrene), poly(ethylene oxide-b-butadiene) or any combination thereof.

The nanoparticle may comprise a surfactant on its surface. Suitable surfactants include oleic acid, polyphosphoric acid and its derivatives, thiol, polyisobutene, single stranded deoxyribonucleic acid, sodium dodecylsulfonate, sodium dodecylbenzenesulfonate, or any combination thereof. In certain embodiments, the nanoparticle may be magnetic. In certain embodiments, the nanoparticle may be transparent at desired wavelengths. In further embodiments, the nanoparticle may be a glass colloid.

The dispersion may comprise at least one solvent 150. In certain embodiments, the solvent may be capable of dispersing nanoparticles. In certain embodiments, the solvent may be capable of swelling or shrinking the substrate, or doing both selectively in different regions of the surface. Suitable solvents include water, diisopropylamine, triethylamine, alkane hydrocarbone, aromatic hydrocarbons, chloroform, ether, tetrahydrofuran, trichloroethylene, cyclohexane, dimethoxyethane, methylene chloride, t-butyl alcohol, ethyl acetate, dioxane, kerosene, synthetic isoparaffinic oil, derivates thereof, or any combination thereof. Suitable alkane hydrocarbons include pentane, hexane, n-heptane, or any combination thereof. Suitable aromatic hydrocarbons include xylene, toluene, benzene, chlorobenzene, decahydronaphthalene, or any combination thereof. In a preferred embodiment, the aromatic hydrocarbon comprises toluene.

Step B shows a deformed substrate 100b. The nano- or microstructures 125, for example, columns or pillars, may be deformed and may swell to reduce the size of and/or change the shape of the cavity 110 and form a deformed cavity 120. In certain embodiments, the substrate may be deformed by at least one external force including a solvent, mechanical force, heat, light, magnetic field, electric field, volume change, or any combination thereof. In a preferred embodiment, the substrate may be deformed by a solvent. Suitable solvents include water, diisopropylamine, triethylamine, alkane hydrocarbone, aromatic hydrocarbons, chloroform, ether, tetrahydrofuran, trichloroethylene, cyclohexane, dimethoxyethane, methylene chloride, t-butyl alcohol, ethyl acetate, dioxane, kerosene, synthetic isoparaffinic oil, derivates thereof, or any combination thereof. In a more preferred embodiment, the solvent may comprise toluene.

The deformation of the deformable substrate 100b may result in the formation of a patterned composition 170 having a relatively planar surface 175 and at least one pattern 190. In certain embodiments, this pattern is characterized as comprising a characteristic dimension of smaller than about 500 microns. In even further embodiments, the pattern is characterized as comprising a characteristic dimension of smaller than about 1 micron. In still further embodiments the pattern is characterized as comprising a characteristic dimension of smaller than about 50 nm. Suitable patterns include, for example, lines, particles, rods, columns, channels, or any combination thereof.

Figure 11:
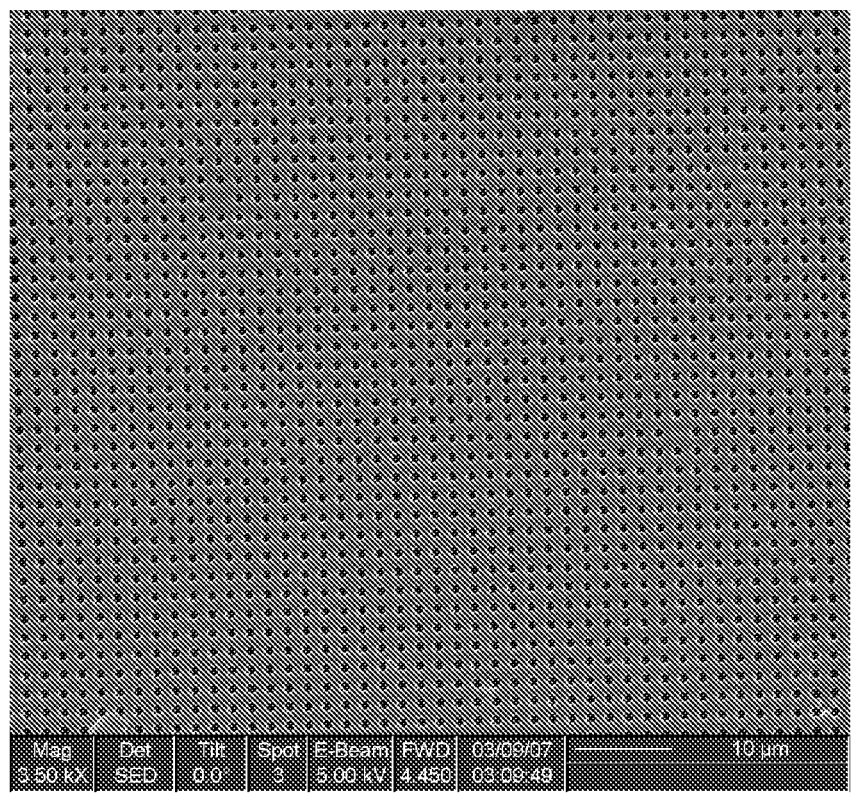
FIG. 11 is an SEM image of the restored PDMS mold after molding.

In certain embodiments, at least a portion of the composition surmounting the deformed substrate is transferred to a receiving substrate by pressing the thin film/mold against the receiving substrate and peeling off the deformed mold. Transfer of the composition to the receiving substrate can be effectuated by suitably coated the deformed substrate with a releasing agent prior to surmounting by the composition, heating the mold or deformed substrate, cooling the mold or deformed substrate, or any combination thereof. Suitable receiving substrates can comprise polymers, biomaterials, ceramics, metals, semiconductors, or any combination thereof. Furthermore, suitable receiving substrates can be either flat or non-planar. In certain embodiments after the composition is transferred, the deformable substrate may return to its original form (FIG. 11). In other embodiments, after the composition is transferred, the deformable substrate may not return to its original form. In further embodiments, after the deformable substrate does not return to its original form, the steps of surmounting the deformable substrate with a composition, deforming the substrate, and transferring at least a portion of the composition to the receiving substrate are repeated. In further embodiments, at least a portion of the transferred composition is heated.

In an exemplary embodiment, solvents may be utilized to control pattern deformation, and a PDMS membrane may be utilized for the assembly of magnetic colloidal nanoparticles.

The master patterns may be fabricated by conventional lithography processes, followed by replica molding to an elastic PDMS mold. When exposed to an organic solvent, such as toluene, PDMS gels swell by as much as 130% (Lee, J. N.; Park, C.; Whitesides, G. M. *Anal. Chem.* 2003, 75, 6544). As the osmotic pressure builds, the circular pores in the PDMS deform and eventually snap shut to relieve the stress (FIG. 1A). The resulting herringbone pattern persists over large regions of the sample. Monodispersed magnetic $Fe_3O_4$ nanoparticles (~10 nm in diameter) dispersed in toluene or other organic solvent may be cast (e.g., drop-casting, dip-coating, spin-casting, cotton-swab wiping) onto the PDMS membrane (FIG. 1B). As the PDMS swells, the convective assembly of the nanoparticles follows (FIG. 1B, step C), which replicates the deformed PDMS membrane.

Several embodiments of the present invention provide new advantages over the existing soft lithography techniques, including 1) reducing micron scale patterns to sub-100 nm features in a single step, 2) the flexibility to create various patterns from a single PDMS mold by applying strains in one or two planar directions, many of which are not possible by conventional soft lithography approach, 3) the flexibility to pattern various nanostructures, particles and rods, with variable sizes and chemical natures, 4) the resulting patterned film can be transferred to other substrates (both hydrophobic and hydrophilic, flat and curved) via contact printing, and 5) the PDMS membranes can be reused providing for a one-step, repeatable process without the requirement of delicate surface preparation or chemistry.

In this example, elastomeric PDMS was utilized as a porous membrane for direct assembly. However, this approach should not be limited to PDMS. Any material with the ability to deform or distort under certain external force is applicable to the present invention.

In this example, toluene was utilized as the solvent to swell and deform the PDMS membrane. Any solvent that can swell the substrate is applicable to the present invention. Furthermore, any other external forces that can induce pattern distortion are applicable to the present invention.

If the deformed state of the deformable substrate is known, the original form of the substrate and the method to deform the substrate can be determined. A theory based on Hookes law (force proportional to extension) may be generalized to elastic sheets. This allows the energy of any particular deformation of the elastic sheet to be calculated. A computer may be utilized to calculate the lowest energy state (the stable state) of the sheet and the calculations may be confirmed against the experimental results. The effects of stretching may be utilized to correctly predict the orientation of, for example, 100 nm by 2 μm features. The theory is linear, and thus, it is possible to determine the original form of a deformable substrate required to achieve the desired final pattern of the deformed substrate. This algorithm allows for the rational design of structures.

The theory may model each collapsed hole as a removal of material from the membrane, technically as a pair of dislocations. Using standard methods of elasticity, the total elastic energy stored in the membrane can be calculated as a function of the orientations of the collapsed holes. The theory applies to flat and curved membranes and to arbitrary hole geometries.

Figure 7A:
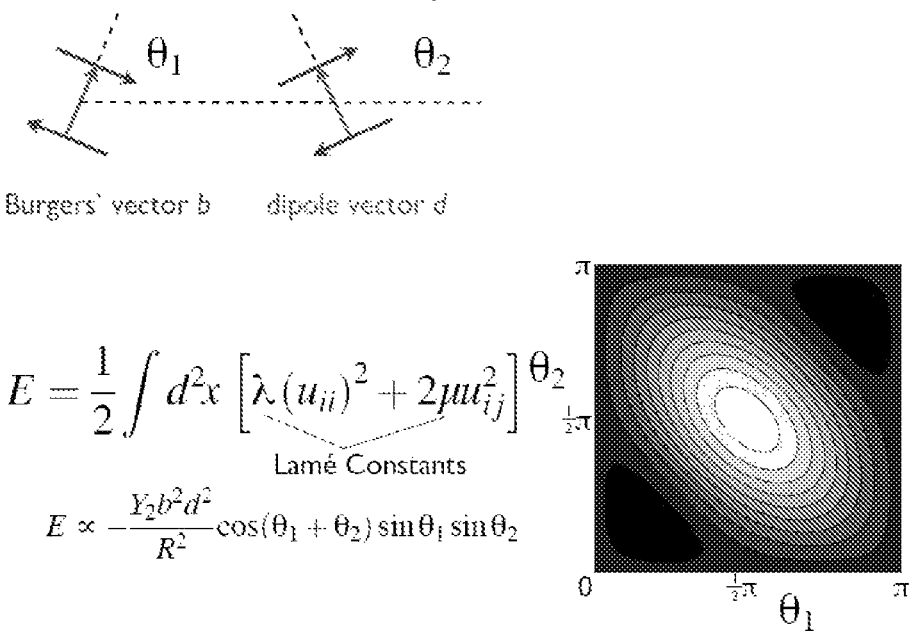
FIG. 7a is a calculation of the interaction energy using continuum elasticity theory in terms of the Young's Modulus, Y2, the Burgers vector, b, the dipole, d, and the separation, R.
Figure 7B:
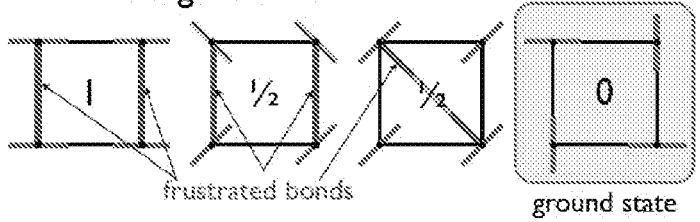
FIG. 7b is a schematic of the dislocation dipoles that appear during isotropic swelling of the PDMS membrane. The interaction is anisotropic. Considering trial configurations on one plaquette leads to the observed herringbone structure.

Continuum elasticity has been developed to control the patterning of the substrate upon swelling. The interaction energy of the substrate may be determined using continuum elasticity theory in terms of the Young's Modulus, Y2, the Burgers vector, b, the dipole vector, d, the separation, R, the angle of Burger's vector, $\theta_1$, and the angle of the dipole vector, $O_2$, as shown in FIG. 7A. This modeling allows control of the long-range structural details of the distortion of the PDMS substrate and the subsequent imprinting of the convectively-assembled metallic nanoparticles. This model allows the study of the self-processing and templating of the metallic arrays. The analysis applies to differently shaped holes of different depths with any variety of spatial and/or periodic distributions. The modeling of the elastic swelling of the substrate allows for top-down control of the resulting deposited patterns. For example, the dislocation dipoles that appear during isotropic swelling of the PDMS membrane can be seen in FIG. 7B.

Applications include microchannels and two dimensional catalytic arrays of arbitrary geometry and perimeter to area ratio. The simultaneous use of different nanoparticles allows for hierarchical patterning (e.g., gold wires with silver or magnetic coatings). Additional geometries can be attained by the application of external stresses on the PDMS substrate.

The present invention has several uses. Suitable uses include developing structures for magnetic arrays, microwave filters, plasmonic effect based sensors, polarized filter devices, dielectric devices, optical devices, optical lenses, acoustic devices, catalytic function devices, diagnostic devices, refractive index gradients, magneto-optical recording bits, magnetic bits for data recording, anti-reflective coatings, flexible electronic devices, heat exchanges devices, cosmetics, dental care, or any combination thereof.

Figure 8:
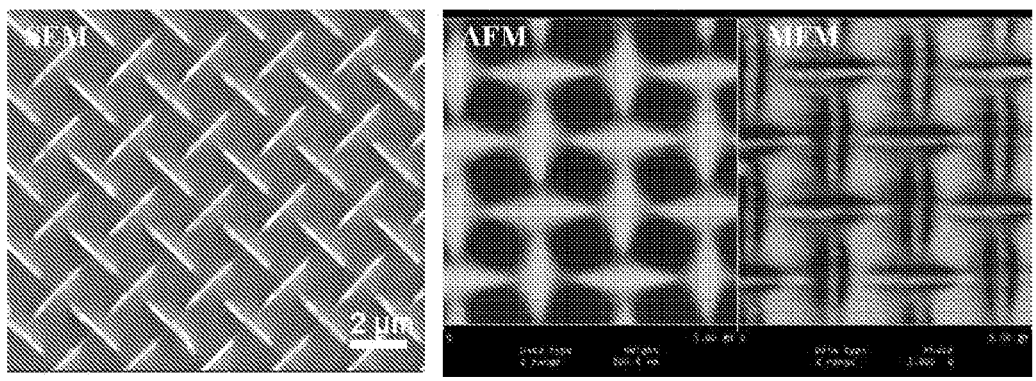
FIG. 8 is an SEM image of Fe$_3$O$_4$ nanoparticle patterns and their corresponding AFM and MFM images.

The present invention can be used to pattern materials with useful dielectric, magnetic, optical, acoustic, or catalytic functions. Applications include monodisperse colloidal or nanoparticle assemblies, where all particles are identical, or binary, ternary or other polydisperse mixtures in which the individual colloidal particles exhibit different sizes, shapes, or physical properties. Using monodisperse particles enables a variety of applications where the resulting shape imparts functionality. For example, ridges of various sizes, shapes, spacings and relative orientations can be used to define magnetic bits when the process is started from a ferrofluid. FIG. 8 shows a magnetic force microscope image indicating that magnetic ridges formed by this process create non-uniform external magnetic fields. The present invention is also useful for creating decoupled magnetic bits with sizes, densities, magnetic anisotropies, shape anisotropies, switching coercive fields, switching speeds and patterning for high density magnetic recording. The present invention can produce devices with two sides: one with ridges and one smooth. The topographic ridges define magnetic bits and the smooth side allows the read/write head to have a very small distance from the recording medium, as is generally necessary to maintain high bit densities and read/write speeds. Analogous structures can also be formed starting from ferroelectric particles.

Optical materials can be fabricated using the present invention by using colloidal materials that are transparent at the desired wavelengths, such as glass for the visible or zinc selenide for the infrared. A second processing step may also be implemented in which the material produced by the initial process is heated to produce a fused material. In the case of glass colloids, the glass may then fuse to form an optically useful shape such as a lens. During this heating step, additional useful patterns or structures may form. Additionally, metastable materials may be utilized which phase separate by, for example, spinodal decomposition upon heating, to form compositional patterns of practical use. One example includes the formation of localized magnetic bits in an otherwise non-magnetic film, which could be used to magnetically isolate the bits. Additionally, a secondary heating step provides for the removal of unwanted additives which are necessary to disperse the colloidal particles. Generally, a secondary heating step is also a means to assemble particles that, after heating, transform to obtain a desired functionality.

Non-monodisperse mixtures of particles may offer advantages. For example, entropic forces which can drive the assembly of large particles when smaller particles are present can be used. Such assembly processes facilitate the aggregation and crystallization of a component within a mixture, which can be guided by the ridge pattern of the material. For example, a mixture of larger magnetic particles and smaller non-magnetic particles may produce a compositional separation within the mixture that drives the magnetic material to accumulate near or at the ridges. This facilitates the formation of magnetic bits for data recording.

In the case of optical materials, particles of different sizes and different indices of refraction may be utilized to produce index of refraction gradients. These gradients can be used to tailor the optical properties of a film for a desired application.

In addition to photonic bandgap materials, the methods of the present invention may be used to manipulate the wavefront properties of coherent light such as laser beams or single photons. For example, a pattern with a fork dislocation (see N. R. Heckenberg, R. McDuff, C. P. Smith, and A. G. White, "Generation of optical phase singularities by computer-generated holograms", *Optics Letters*, 1992, 17 (3), 221-223) can be produced by controlling the template geometry and yields light with a helical wavefront. This can be useful as a new polarization state carrying orbital angular momentum. This general approach can be extended to a process of wavefront engineering, by which the desired wavefront is specified, the necessary pattern is computed, and then the substrate and film necessary to realize that pattern is computed using the theory described herein.

Such structural anisotropy can be directly patterned to polymer films using the same swelling principle or replicated into polymers or polymer/inorganic composite films using the nanoparticle assembly. The anisotropic surface characteristics and potential tunablility between different patterns in polymeric materials are of interest in controlled wetting, friction and adhesion. For example, the herringbone structures (in cm length scale) are commonly used in tires and floor mats as Diamond-tread to prevent friction.

Applications in tunable phononic bandgap materials. (K. Bertoldi and M. C. Boyce, "Mechanically triggered transformations of phononic band gaps in periodic elastomeric structures", *Physical Review B* 77, 052105 2008). Phononic crystals are periodic elastic structures which exhibit a range in frequency where elastic wave propagation is barred. The ability to design structures with such phononic band gaps (PBGs) has been of growing interest in recent years due to their potential as sound filters, acoustic mirrors, acoustic wave guides, and vibration isolators and in transducer design. Typical structures take the form of 2D or 3D arrays of inclusions of one or more materials in a matrix with contrasting properties. The position and width of the PBGs can be tailored by the selection of i) constituent materials with contrasting densities and contrasting speeds of sound, ii) lattice topology, iii) lattice spacing, and iv) volume fraction of inclusions. Therefore, the properties of phononic crystals can be modified through direct physical changing of the positioning and dimensions of the periodic geometry, for example, from circular square lattice to herringbone structures with periodic array of mutually orthogonal, ellipses.

A benefit of the present invention is the ability to produce different materials using the same or similar templates multiple times. In this manner, one may obtain materials in which there is alignment or registration between features in the different films. For example, two films can be created, one containing an array of optical lenses and another containing an array of magneto-optical recording bits.

EXAMPLES AND OTHER ILLUSTRATIVE EMBODIMENTS

Example 1

Convective Assembly of $Fe_3O_4$ Nanoparticles on PDMS Membrane

Figure 14:
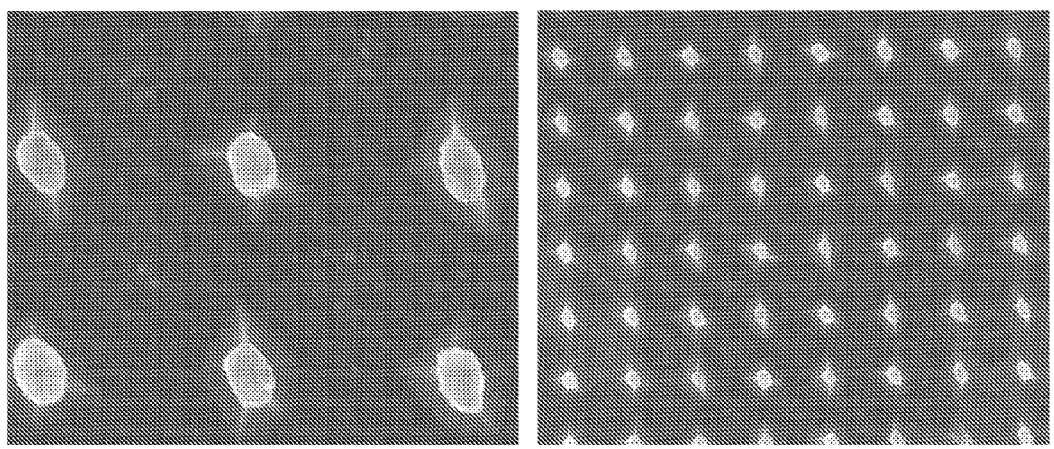
FIG. 14 are SEM images of Fe$_3$O$_4$ nanoparticle assembly from square patterned PDMS membranes with holes of diameter of 1 µm, pitch of 2 µm and height of 1 µm.

1) PDMS membrane mold preparation was previously presented. Zhang, et al. "Replica Molding of High-Aspect-Ratio Polymeric Nanopillar Arrays with High Fidelity", *Langmuir* 2006, 22, 8595-8601). A high aspect ratio of the relief structure is beneficial to create desired patterns. Currently an aspect ratio≥9 is sufficient for square array pattern with 1 µm diameter, 2 µm pitch and 9 µm height patterns. At an aspect ratio of 1, the effect of deformation can no longer be observed (FIG. 14).

2) Ferrofluid (EMG911, Ferrotec. Inc.) was used directly without any treatment. As reported from the manufacture, the ferrofluids were made from 1.7% (v/v) ~10 nm $Fe_3O_4$ nanoparticles with anionic surfactant capping layer and dispersed in synthetic isoparaffinic oil. In order to obtain a more uniform film, magnetic $Fe_3O_4$ particles from ferrofluid (0.5 ml) were extracted by precipitation in acetone (5 ml) and re-dispersed in toluene with a concentration of 2-5% (w/v).

3) The magnetic $Fe_3O_4$ nanoparticle solution was applied to the PDMS membrane substrate by either drop-casting, dip-coating, spin-casting, or cotton-swab wiping. The solvent swelled the PDMS and deformed the pore arrays. Within 2 minutes, the solvent was dried and the nanoparticles were deposited on the deformed PDMS membrane, forming a thin film. The film thickness can be varied by changing the solution concentrations and casting methods. The magnetic particle thin film was then transferred to a receiving substrate by slightly pressing the PDMS membrane onto the substrates and peeling off the PDMS membrane.

Example 2

Convective Assembly of $Fe_3O_4$ Nanoparticles on Mechanically Stretched PDMS Membranes A customized jig was constructed from a large acrylic base and two sliders whose positions could be adjusted continuously by two long thread M4 wing screws. Small binder clips connected to each of the two sliders were clamped to the edges of the PDMS membrane. After stretching the PDMS membrane (Lin, P.; Yang, S. *Appl. Phys. Lett.* 2007, 90, 241903) the nanoparticle solution was applied using the same method described above.

Example 3

Convective Assembly of Co Nanoparticles on PDMS Membrane

Figure 12:
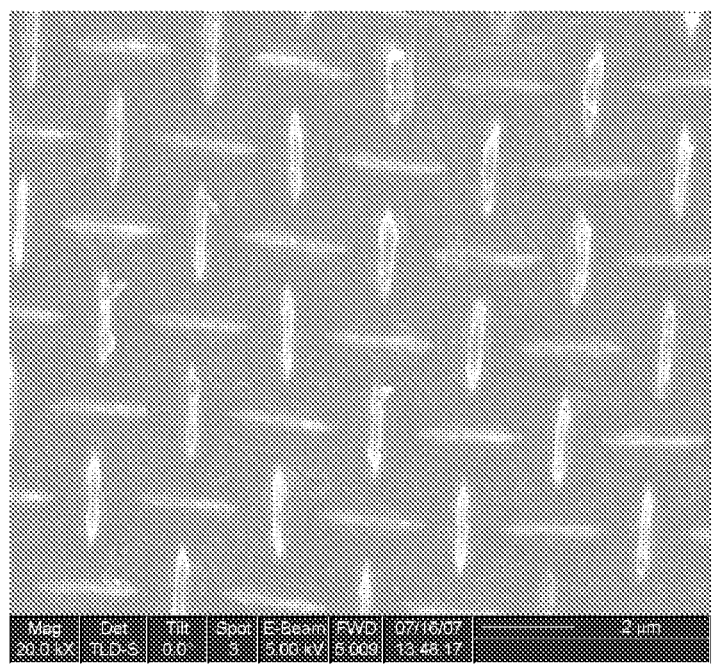
FIG. 12 is an SEM image of Co nanoparticle assembly from square patterned PDMS membranes with holes of diameter of 1 µm, pitch of 2 µm and height of 9 µm.

A PDMS membrane mold was prepared as in Example 1. Co nanoparticles were prepared following the procedure as in Park. et al, "Superlattice and Magnetism Directed by the Size and Shape of Nanocrystals" *Chemphyschem*, 2002, 6, 543. The Co particles were dispersed in toluene with a concentration of 2-5% (w/v) and applied to the PDMS membrane by either drop-casting, dip-coating, spin-casting, or cotton-swab wiping. The resultant Co particle thin film was then transferred to a receiving substrate by slightly pressing the PDMS membrane onto the substrates and peeling off the PDMS membrane (FIG. 12).

Example 4

Convective Assembly of Ag Nanoparticles on PDMS Membrane

Figure 13:
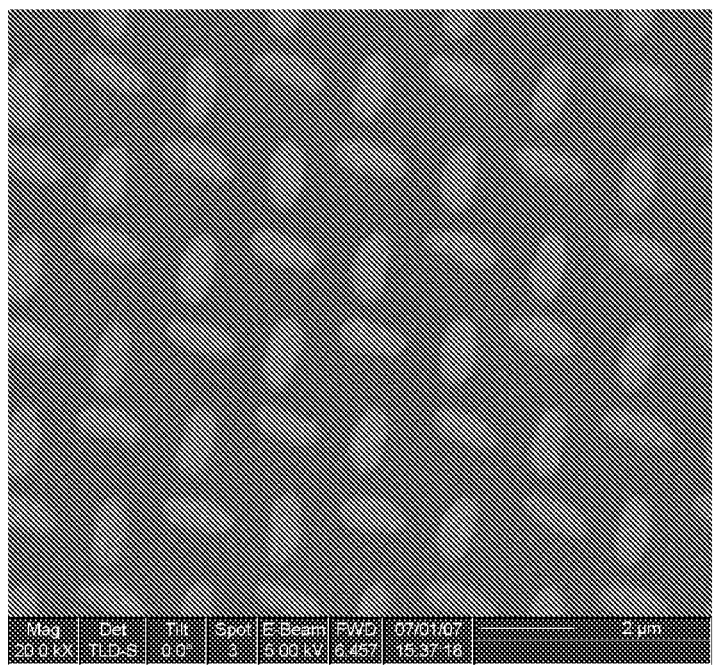
FIG. 13 is an SEM image of Ag nanoparticle assembly from square patterned PDMS membranes with holes of diameter of 1 µm, pitch of 2 µm and height of 9 µm.

A PDMS membrane mold was prepared as in Example 1. Ag nanoparticles were prepared following the procedure as in Park. et al, "High-Density Silver Nanoparticle Film with Temperature-Controllable Interparticle Spacing for a Tunable Surface Enhanced Raman Scattering Substrate" *Nano letters*, 2005, 5, 5. The Ag particles were dispersed in toluene with a concentration of 2-5% (w/v) and applied to the PDMS membrane by either drop-casting, dip-coating, spin-casting, or cotton-swab wiping. The resultant Ag particle thin film was then transferred to a receiving substrate by slightly pressing the PDMS membrane onto the substrates and peeling off the PDMS membrane (FIG. 13).

Example 5

Molding of hydrogel herringbone patterns was performed using the same PDMS membrane or mold as reported in Zhang, et al. "Replica Molding of High-Aspect-Ratio Polymeric Nanopillar Arrays with High Fidelity", *Langmuir* 2006, 22, 8595-8601, similar to the approach to fabricate the nanoparticle films. The following is an exemplary procedure:

1) 2.5 ml EGDMA was mixed with 3 wt % Darocur 1173 and exposed to UV light (8 mW/cm$^2$) for 30 seconds to obtain a prepolymer solution. 2 wt % Darocur 1173 was further mixed into this solution.

2) The inverse replica of the micropillar arrays were formed by pouring a 8:1 (by weight) mixture of PDMS prepolymer and curing agent (GE Silicones) on the silicon micropillar arrays (square micropillars 9 μm high, 1 μm wide and 2 μm pitch) followed by thermal curing at 65° C. for 4 hours. The PDMS membrane was carefully peeled off the silicon master. To form the hydrogel micropillar array with herringbone pattern, the hydrogel prepolymer solution was dropped on a glass slide and the PDMS membrane of the silicon master was pressed over it carefully, followed by UV crosslinking for 10 minutes.

Figure 9:
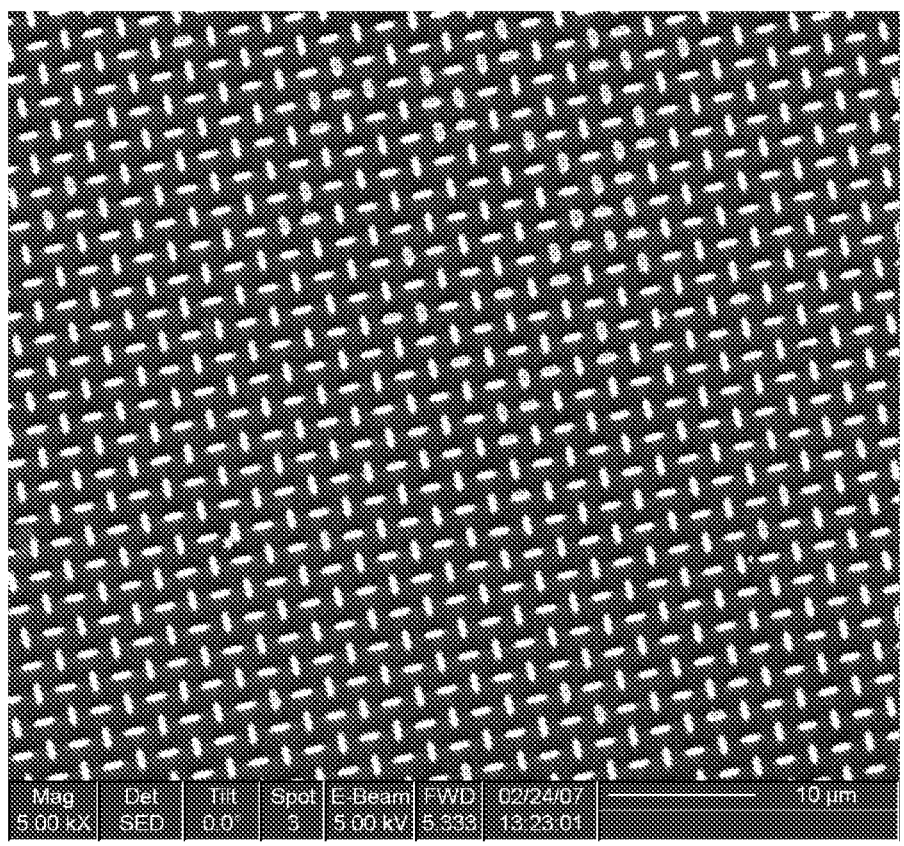
FIG. 9 is an SEM image of EGDMA herringbone pattern.
Figure 10:
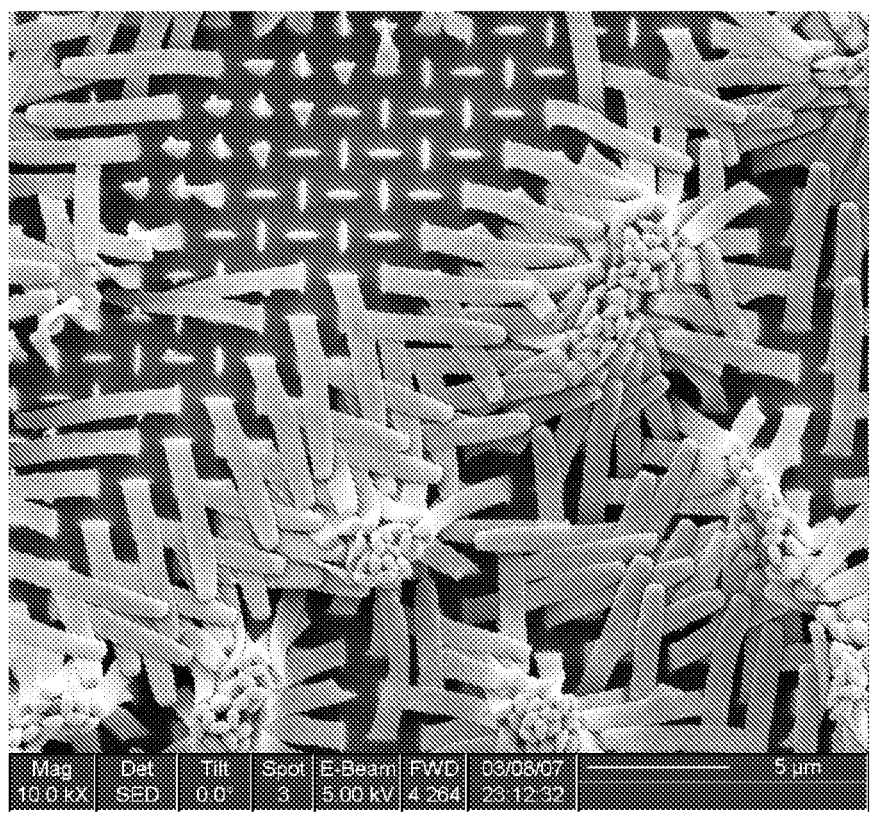
FIG. 10 is an SEM image of EGDMA nanoribbons.

During the molding process, the PDMS membrane was swollen by the prepolymer solution and deformed, similar to the deformation of PDMS membrane, and the pores were partially closed resulting in a hydrogel herringbone pattern (FIG. 9) and highly deformed hydrogel nanoribbon structures (FIG. 10). Without being bound by any particular theory of operation, the PDMS mold is completely restored to its original shape (FIG. 11) because the hydrogel apparently does not penetrate into the PDMS membrane. This approach allows for recycling of the PDMS membrane for fabrication of polymer patterns.

Example 6

Replica Fe$_3$O$_4$ Nanoparticle Film to Epoxy Film

After transferring Fe$_3$O$_4$ nanoparticle film onto a glass substrate, the sample was heated up to 150° C. for 5 min and then cooled to room temperature. The sample was evaporated with (tridecafluoro-1,1,2,2-tetrahydrooctyl)trichlorosilane (Gelest Inc.) under vacuum as the release agent.

A PDMS prepolymer and curing agent (RTV615, GE Silicones) was thoroughly mixed in the weight ratio of 10:1, followed by degassing for 1 hour to remove the air bubbles. The liquid PDMS prepolymer mixture was poured over the Fe$_3$O$_4$ nanoparticle film and cured at 80° C. for 2 hours. The PDMS mold was carefully peeled off from the Fe$_3$O$_4$ nanoparticle film.

Figure 15:
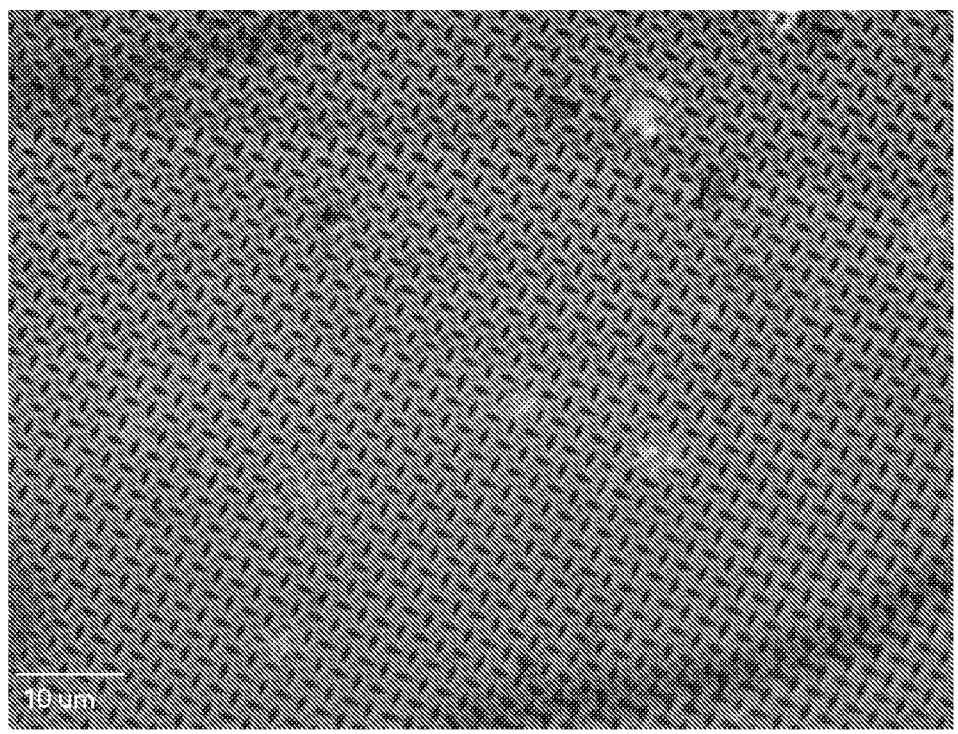
FIG. 15 is SEM image of epoxy film replicated from the deformed Fe$_3$O$_4$ nanoparticle film from square patterned PDMS membranes with holes of diameter of 1 µm, pitch of 2 µm and height of 9 µm (see FIG. 3a).

An epoxy material (SU8-2, MicroChem Corp.) was spin-coated onto a microscope cover glass at the speed of 3000 rpm/s for 30 sec. The film was heated up to 65° C. for 5 min and then heated up to 95° C. At 95° C., the PDMS mold that replicated from Fe$_3$O$_4$ nanoparticle film was pressed against the epoxy film. The PDMS mold and the epoxy film were cooled down to room temperature and the PDMS mold was carefully peeled off from the epoxy film. The nanostructures were transferred to the epoxy film (FIG. 15). The epoxy film can be furthered crosslinked under UV light exposure.

Based on the description of the embodiments of the invention, it can be appreciated that this invention is not limited to the particular embodiments disclosed but it is intended to cover modifications that are within the spirit and scope of the invention.

What is claimed:

1. A method for predictably patterning a structure comprising:

surmounting a deformable substrate, having an original form, with a composition,
   wherein the deformable substrate is capable of achieving at least one predetermined deformed state;
   predictably deforming said deformable substrate from its original form to the at least one predetermined deformed state;
   transferring at least a portion of the composition surmounting the deformed substrate to a receiving substrate; and
   predicting the at least one predetermined deformed state based upon the elastic energy of the deformable substrate,
   wherein the elastic energy of the deformable substrate is determined by the following equation:

$$E \propto -\frac{Y_2 b^2 d^2}{R^2}\cos(\theta_1+\theta_2)\sin\theta_1\sin\theta_2$$

wherein E is the elastic energy of the deformable substrate, $Y_2$ is Young's modulus, b is Burger's vector, d is the dipole vector, R is the separation, $\theta_1$ and $\theta_2$ are the angles of the Burger's vector and the dipole vector respectively.

2. The method of claim 1 wherein surmounting includes drop-casting, dip-coating, spincasting, cotton-swab wiping, microcontact printing, application by roller, or any combination thereof.

3. The method of claim 1 wherein the deformable substrate comprises a polymer capable of being deformed under strain induced by solvent, heat, light, volume change, magnetic force, electrical field, pH, mechanical force, pressure, or any combination thereof.

4. The method of claim 3 wherein the polymer includes polydimethylsiloxane, a polydimethylsiloxane composite, poly(N-isopropyl acrylamide), poly(acrylic acid), poly(methacrylic acid), poly(2-hydroxyethylmethacrylate), polyurethane, poly(ethylene glycol), poly(ethylene terephthalate), poly(ethylene 1,4-napthanate), poly(ethylene 1,5-napthanate), poly(ethylene 2,6-napthanate), poly(ethylene 2,7-napthanate), or any copolymer thereof, or any composite thereof, or any combination thereof.

5. The method of claim 1 wherein the deformable substrate comprises nano- or microstructures characterized as pillars, cylinders, particles, rods, or any combination thereof.

6. The method of claim 5 wherein the nano-microstructures have a high aspect ratio.

7. The method of claim 6 wherein the high aspect ratio is greater than about 1.

8. The method of claim 6 wherein the high aspect ratio is greater than about 9.

9. The method of claim 6 wherein the high aspect ratio is greater than about 25.

10. The method of claim 1 wherein the transferred portion of the composition surmounting the deformed substrate to a receiving substrate contains a pattern.

11. The method of claim 10 wherein the pattern is characterized as comprising a characteristic dimension of smaller than about 500 microns.

12. The method of claim 11 wherein the pattern is characterized as comprising a characteristic dimension of smaller than about 1 micron.

13. The method of claim 12 wherein the pattern is characterized as comprising a characteristic dimension of smaller than about 50 nm.

14. The method of claim 10 wherein the pattern includes lines, particles, rods, columns, channels, or any combination thereof.

15. The method of claim 1 wherein the composition comprises a nanoparticle dispersion, a polymeric dispersion, a polymer solution, a prepolymer precursor, a sol-gel precursor, an organic hybrid precursor, an inorganic hybrid precursor, an organic liquid dispersion, a cell dispersion, a protein dispersion, a DNA dispersion, a peptide dispersion, or any combination thereof.

16. The method of claim 15 wherein the nanoparticle dispersion includes at least one nanoparticle assembly, colloidal nanoparticle assembly, or any combination thereof.

17. The method of claim 16 wherein the nanoparticle contains a surfactant on its surface.

18. The method of claim 17 wherein the surfactant includes oleic acid, polyphosphoric acid and its derivatives, thiol, polyisobutene, single stranded deoxyribonucleic acid, sodium dodecylsulfonate, sodium dodecylbenzenesulfonate, or any combination thereof.

19. The method of claim 15 wherein the nanoparticle dispersion is mono disperse.

20. The method of claim 15 wherein the nanoparticle dispersion is polydisperse.

21. The method of claim 20 wherein the dispersion contains particles of different sizes.

22. The method of claim 20 wherein the dispersion contains particles of different shapes.

23. The method of claim 20 wherein the dispersion contains particles with different physical properties.

24. The method of claim 20 wherein the dispersion contains particles of different refractive indices.

25. The method of claim 20 wherein the dispersion contains particles with transparencies at different wavelengths.

26. The method of claim 15 wherein the nanoparticle is a metal nanoparticle, a semiconductor nanoparticle, a polymer based nanoparticle, a carbon based nanoparticle, or any combination thereof.

27. The method of claim 26 wherein the metal nanoparticle is a noble metal, a ferrous metal, a non-ferrous metal, an oxide of ferrous metals and non-ferrous metals, a metal alloy, or any combination thereof.

28. The method of claim 27 wherein the noble metal is gold, silver, platinum, or any combination thereof.

29. The method of claim 27 wherein the non-ferrous metal is cobalt, nickel, aluminum, titanium, copper, zinc, copper, or any combination thereof.

30. The method of claim 27 wherein the oxide of ferrous metals and non-ferrous metals includes iron(2+) oxide, iron(3+) oxide, zirconium oxide, titanium oxide, tin oxide, aluminum(3+) oxide, aluminum(2+) oxide, or any combination thereof.

31. The method of claim 30 wherein the oxide is iron(3+) oxide.

32. The method of claim 27 wherein the metal alloy is FePt.

33. The method of claim 27 wherein the semiconductor nanoparticle includes CdSe, CdS, CdTe, ZnS, SiO2, Si, PbSe, SiGe, Ge, ZnSe, ZnO, GaAs, GaAlAs, GaN, GaAlN, GeTe, (Ga,Mn)As, (Zn,Mn)As, (Zn,Mn)S, (Cd,Mn)S, (Cd,Mn)Se, (Zn,Mn)O, (Ga,Mn)N, or any combination thereof including core-shell geometries, ordered alloys, random alloys, solid solutions, or random or ordered phase separated mixtures.

34. The method of claim 27 wherein the polymer-based nanoparticles include polystyrene, poly(methyl methacrylate), poly(N-isopropylacrylamide), poly(lactic acid-co-glycolic acid), block copolymers, such as poly(styrene-b-methacrylate), poly(ethylene oxide-b-styrene), poly(ethyleneoxide-b-butadiene) or any combination thereof.

35. The method of claim 15 wherein the nanoparticle is magnetic.

36. The method of claim 15 wherein the nanoparticle is transparent at desired wavelengths.

37. The method of claim 15 wherein the nanoparticle is a glass colloid.

38. The method of claim 15 wherein in the dispersion contains at least one solvent.

39. The method of claim 38 wherein the solvent is capable of dispersing nanoparticles.

40. The method of claim 38 wherein the solvent is capable of swelling or shrinking the substrate, or doing both selectively in different regions of the surface.

41. The method of claim 38 wherein the solvent includes water, diisopropylamine, triethylamine, alkane hydrocarbone, aromatic hydrocarbons, chloroform, ether, tetrahydrofuran, trichloroethylene, cyclohexane, dimethoxyethane, methylene chloride, t-butyl alcohol, ethyl acetate, dioxane, kerosene, synthetic isoparaffinic oil, derivates thereof, or any combination thereof.

42. The method of claim 41 wherein the alkane hydrocarbons include pentane, hexane, nheptane, or any combination thereof.

43. The method of claim 41 wherein the aromatic hydrocarbons include xylene, toluene, benzene, chlorobenzene, decahydronaphthalene, or any combination thereof.

44. The method of claim 43 wherein the aromatic hydrocarbon comprises toluene.

45. The method of claim 1 wherein the deformable substrate is deformed by at least one external force including a solvent, mechanical force, heat, light, magnetic field, electric field, volume change, or any combination thereof.

46. The method of claim 45 wherein the deformable substrate is deformed by a solvent.

47. The method of claim 46 wherein the solvent includes water, diisopropylamine, triethylamine, alkane hydrocarbone, aromatic hydrocarbons, chloroform, ether, tetrahydrofuran, trichloroethylene, cyclohexane, dimethoxyethane, methylene chloride, t-butyl alcohol, ethyl acetate, dioxane, kerosene, synthetic isoparaffinic oil, derivates thereof, or any combination thereof.

48. The method of claim 47 wherein the solvent comprises toluene.

49. The method of claim 1 wherein the transfer of at least a portion of the composition to a receiving substrate is effectuated by pressing the thin film/mold against the receiving substrate and peeling off the deformed mold, by coating the deformable substrate with a releasing agent prior to surmounting by the composition, by heating the mold or deformable substrate, by cooling the mold or deformable substrate, or any combination thereof.

50. The method of claim 1 wherein the receiving substrate includes polymers, biomaterials, ceramics, metals, semiconductors, or any combination thereof.

51. The method of claim 1 wherein the a receiving substrate is flat or non-planar.

52. The method of claim 1 further comprising the deformable returning to its original form.

53. The method of claim 1 wherein after the composition is transferred, the deformable substrate does not return to its original form.

54. The method of claim 53 wherein the steps of surmounting the deformable substrate with a composition, deforming the substrate, and transferring at least a portion of the composition to a receiving substrate is repeated.

55. The method of claim 1 further comprising heating at least a portion of the transferred composition.

56. The method of claim 1 for the use of developing structures for magnetic arrays, microwave filters, plasmonic effect based sensors, polarized filter devices, dielectric devices, optical devices, optical lenses, acoustic devices, catalytic function devices, diagnostic devices, refractive index gradients, magneto-optical recording bits, magnetic bits for data recording, antireflective coatings, flexible electronic devices, heat exchanges devices, cosmetics, dental care, or any combination thereof.

* * * * *